(12) United States Patent
Iwaida et al.

(10) Patent No.: US 7,545,187 B2
(45) Date of Patent: Jun. 9, 2009

(54) PLL CIRCUIT AND WIRELESS DEVICE

(75) Inventors: Mineyuki Iwaida, Kyoto (JP); Takeshi Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/030,480

(22) Filed: Feb. 13, 2008

(65) Prior Publication Data
US 2008/0197897 A1   Aug. 21, 2008

(30) Foreign Application Priority Data
Feb. 16, 2007   (JP)   ............................... 2007-036693

(51) Int. Cl.
*H03L 7/06* (2006.01)
(52) U.S. Cl. ........................ 327/156; 327/148; 327/157
(58) Field of Classification Search ........................ None
See application file for complete search history.

(56) References Cited

U.S. PATENT DOCUMENTS

| | | | | |
|---|---|---|---|---|
| 5,907,253 A * | 5/1999 | Davis et al. | ................... | 327/156 |
| 6,163,184 A * | 12/2000 | Larsson | ....................... | 327/156 |
| 6,667,640 B2 * | 12/2003 | Asano | ......................... | 327/147 |
| 6,829,318 B2 * | 12/2004 | Kawahara | .................... | 375/376 |
| 7,348,818 B2 * | 3/2008 | Hulfachor et al. | ........... | 327/156 |
| 7,496,168 B2 * | 2/2009 | Leonowich et al. | .......... | 375/376 |

2001/0052823 A1   12/2001   Hirano et al.

FOREIGN PATENT DOCUMENTS

JP   3488180   10/2003

\* cited by examiner

*Primary Examiner*—Cassandra Cox
(74) *Attorney, Agent, or Firm*—Hamre, Schumann, Mueller & Larson, P.C.

(57) ABSTRACT

A PLL circuit according to the present invention includes: a voltage controlled oscillator 10; a frequency divider 30 that divides an oscillation signal of the voltage controlled oscillator 10 and outputs a divided oscillation signal; a first phase comparator 40 that outputs a phase difference between the divided oscillation signal of the frequency divider 30 and a reference signal; a charge pump 60 that converts the output signal of the first phase comparator 40 into a signal for controlling the voltage controlled oscillator 10; a filter that allows a DC component of the output signal of the charge pump 60 to pass therethrough and outputs a voltage to the voltage controlled oscillator 10; a second phase comparator 90 that averages the phase difference between the divided oscillation signal of the frequency divider 30 and the reference signal with respect to time; and a current control circuit 100 that controls an operating current of the frequency divider 30 based on the phase difference averaged with respect to time by the second phase comparator 90. With this configuration, it is possible to provide a PLL circuit that achieves low power consumption and covers a wide range of oscillation frequencies.

5 Claims, 12 Drawing Sheets

PLL CIRCUIT AND WIRELESS DEVICE

BACKGROUND OF THE INVENTION

1. Field of the Invention

The present invention relates to a PLL (phase locked loop) circuit. The present invention further relates to a wireless device including the PLL circuit.

2. Description of Related Art (First Conventional Configuration)

FIG. 13 is a block diagram showing a PLL circuit with a first conventional configuration. The PLL circuit in FIG. 13 includes a voltage controlled oscillator 10, a frequency divider 31, a first phase comparator 40, a reference signal input terminal 50, a charge pump 60, and a filter 70.

An operation of the PLL circuit with the above-described configuration will be described with reference to FIG. 13.

The frequency divider 31 divides an oscillation signal ($f_{VCO}$) of the voltage controlled oscillator 10 at such a dividing ratio that the oscillation signal has the same frequency as that of a reference signal ($f_{REF}$) input from the reference signal input terminal 50 to the first phase comparator 40. The first phase comparator 40 outputs a phase difference between a divided oscillation signal ($f_{DIV}$) output from the frequency divider 31 and $f_{REF}$ input from the reference signal input terminal 50. The charge pump 60 converts the output signal of the first phase comparator 40 into a signal suitable for control of the voltage controlled oscillator 10. The filter 70 allows a DC component of the output signal of the charge pump 60 to pass therethrough so as to apply a control voltage to the voltage controlled oscillator 10. The voltage controlled oscillator 10 oscillates at a frequency ($f_{VCO}$) in accordance with the control voltage output from the filter 70. An oscillation signal output from the voltage controlled oscillator 10 is input to the frequency divider 31, followed by the repetition of the above-described operation.

By repeated cycles of the above-described operation, when $f_{DIV}$ output from the frequency divider 31 is matched with $f_{REF}$ input from the reference signal input terminal 50, the PLL circuit is locked.

In FIG. 14, (a) is a characteristic diagram showing a change of the oscillation frequency $f_{VCO}$ with time in the PLL circuit shown in FIG. 13, and (b) is a characteristic diagram showing a change of a current $i_{DIV}$ of the frequency divider 31 with time. In FIG. 14, a vertical axis in (a) represents the oscillation frequency ($f_{VCO}$) of the voltage controlled oscillator 10, and a vertical axis in (b) represents the current ($i_{DIV}$) of the frequency divider 31. A timing $t_E$ on a horizontal axis is a timing at which the PLL circuit is locked. In FIG. 14, $f_L$, $f_H$, $f_{LL}$, $f_{HH}$, and $f_E$ on the vertical axis in (a) represent a lower limit operation frequency, an upper limit operation frequency, a frequency ($f_L$−margin), a frequency ($f_H$+margin), and a lock frequency, respectively, of the voltage controlled oscillator 10, and $i_{fL}$, $i_{fH}$, $i_{fLL}$, and $i_{fHH}$ on the vertical axis in (b) represent currents necessary for the frequency divider 31 to divide the frequency at the set dividing ratio in the cases where $f_{VCO}$ is $f_L$, $f_H$, $f_{LL}$, and $f_{HH}$, respectively. In general, the frequency divider requires a larger current to divide a higher frequency. As shown in (a) in FIG. 14, an oscillation frequency range of the voltage controlled oscillator 10 is set with margins provided in addition to an operation range taking into consideration manufacturing variations of the PLL circuit, temperature fluctuations after the PLL circuit is locked, power supply voltage fluctuations, and the like.

As shown in FIG. 14, in the PLL circuit shown in FIG. 13, since the oscillation frequency may reach $f_{HH}$, the frequency divider 31 requires the current $i_{fHH}$.

(Second Conventional Configuration)

FIG. 15 is a block diagram showing a PLL circuit with a second conventional configuration. The PLL circuit in FIG. 15 includes a voltage switching device 80 and a second phase comparator 92 in addition to the components of the PLL circuit shown in FIG. 13. FIG. 16 is a diagram showing an example of specific configurations of a voltage controlled oscillator 11 and the voltage switching device 80 as components of the PLL circuit in FIG. 15.

An operation of the PLL circuit with the above-described configuration will be described with reference to FIGS. 15 and 16.

The second phase comparator 92 averages a phase difference (frequency difference) between $f_{DIV}$ and $f_{REF}$ with respect to time, and outputs a control signal when the phase difference between $f_{DIV}$ and $f_{REF}$ is adjusted within a predetermined range. The voltage switching device 80 switches a voltage to be applied to the voltage controlled oscillator 11 in accordance with the signal output from the second phase comparator 92.

As shown in FIG. 16, the voltage switching device 80 includes a variable capacitor voltage output terminal 801, a control input terminal 802, a constant-voltage supply 803, a charge pump voltage input terminal 804, and a switch 805. The control input terminal 802 is connected to the output of the second phase comparator 92. The charge pump voltage input terminal 804 is connected to an output of the filter 70.

The switch 805 is connected to a constant-voltage supply 803 side at the start of adjustment of $f_{VCO}$ (during a coarse adjustment period), and then is connected to a charge pump voltage input terminal 804 side after the phase difference between $f_{DIV}$ and $f_{REF}$ is adjusted within the predetermined range (during a fine adjustment period). A voltage $V_0$ or $V_{CP}$ selected by the switch 805 is output from the variable capacitor voltage output terminal 801.

As shown in FIG. 16, the voltage controlled oscillator 11 includes a variable capacitor voltage input terminal 111, a capacitor 112, a variable capacitor 113, switches 114a, 114b, and 114c, capacitors 115a, 115b, and 115c, an inductor 116, an oscillation circuit 117, and an oscillation signal output terminal 118.

During the coarse adjustment period, $V_0$ is applied to the variable capacitor voltage input terminal 111, so that the variable capacitor 113 has a fixed capacitance determined by $V_0$. By switching the switches 114a, 114b, and 114c selectively, the capacitors 115a, 115b, and 115c can be operated selectively so as to change a capacitance value discretely.

During the fine adjustment period, $V_{CP}$ is applied to the variable capacitor voltage input terminal 111. Accordingly, the variable capacitor 113 has a capacitance determined by $V_{CP}$, and the capacitance value is changed continuously.

The PLL circuit shown in FIG. 15 is operated in a manner different from that of the PLL circuit shown in FIG. 13 in that the second phase comparator 92 switches between the coarse adjustment period and the fine adjustment period so as to adjust the frequency, followed by a lock of the PLL circuit. Although $f_{VCO}$ is unstable during the coarse adjustment period, a coarse adjustment can be made without a malfunction of the PLL circuit because the second phase comparator 92 outputs the time-averaged phase difference between $f_{DIV}$ and $f_{REF}$.

FIG. 17 is a characteristic diagram showing a change of an oscillation frequency in the PLL circuit shown in FIG. 15. In FIG. 17, $f_S$ on a vertical axis represents a frequency at the start of the coarse adjustment, and $t_C$ on a horizontal axis represents a timing of finishing the coarse adjustment. The other symbols are the same as those in FIG. 14, and thus their descriptions will be omitted. As shown in FIG. 17, the frequency is adjusted discretely until the timing $t_C$, and then the frequency is adjusted continuously after the timing $t_C$. The PLL circuit is locked at a timing $t_E$.

In the PLL circuit shown in FIG. 15, the frequency divider 31 requires the current $i_{fHH}$ as in the PLL circuit shown in FIG. 13. Such a configuration is used to obtain a wide oscillation frequency range, and is described in Patent document 1 (Japanese Patent No. 3488180), for example.

As shown in FIGS. 14 and 17, in each of the PLL circuits shown in FIGS. 13 and 15, in order for the frequency divider 31 to perform a normal dividing operation at the oscillation frequency $f_{HH}$, the current $i_{fHH}$ is required, which is larger than the current $i_{FH}$ required at the upper limit operation frequency $f_H$.

Further, since the PLL circuit shown in FIG. 15 is suitable for forming a capacitor and an inductor on a single semiconductor substrate, all the components can be included in a semiconductor integrated circuit. In such a case, it is difficult to adjust values of the capacitor and the inductor that determine the oscillation frequency after the formation of the semiconductor integrated circuit. On this account, margins to be provided in addition to an operation frequency range as shown in FIG. 17 have to be set larger than those shown in FIG. 14. As a result, the current $i_{fHH}$ becomes larger.

In recent years, the upper limit operation frequency is becoming higher due to the development of broadband wireless communication, and accordingly it is increasingly required to reduce the margins to be provided in addition to the operation frequency range.

When a wireless device including the PLL circuit that requires a large current as shown in FIG. 13 or 15 is operated by being powered through a battery, it is difficult to operate the wireless device for a long time since the PLL circuit consumes a large amount of power. To operate the wireless device for a long time, a larger battery may be prepared, which, however, brings about another problem in that it becomes difficult to achieve the downsizing of the wireless device.

SUMMARY OF THE INVENTION

It is an object of the present invention to provide a PLL circuit that can achieve low power consumption and a wide oscillation frequency range. Further, it is an object of the present invention to provide a wireless device that can achieve low power consumption, a wide oscillation frequency range, and downsizing.

A PLL circuit according to the present invention includes: a voltage controlled oscillator; a frequency divider that divides an oscillation signal of the voltage controlled oscillator and outputs a divided oscillation signal; a first phase comparator that outputs a phase difference between the divided oscillation signal of the frequency divider and a reference signal; a charge pump that converts the output signal of the first phase comparator into a signal for controlling the voltage controlled oscillator; a filter that allows a DC component of the output signal of the charge pump to pass therethrough and outputs a voltage to the voltage controlled oscillator; a second phase comparator that averages the phase difference between the divided oscillation signal of the frequency divider and the reference signal with respect to time; and a current control circuit that controls an operating current of the frequency divider based on the phase difference averaged with respect to time by the second phase comparator.

According to the PLL circuit of the present invention, even when the PLL circuit generates a wide range of frequencies from a low frequency to a high frequency, the current control circuit is operated to decrease the current of the frequency divider in accordance with the output result of the second phase comparator, thereby reducing power consumption.

A wireless device according to the present invention being capable of at least receiving or transmitting a radio wave, includes: a high-frequency amplifier that amplifies a high-frequency signal received with an antenna; a PLL circuit that generates an oscillation signal; a mixer that generates a low-frequency signal from the high-frequency signal output from the high-frequency amplifier and the oscillation signal output from the PLL circuit; a low-frequency amplifier that amplifies the low-frequency signal output from the mixer; and a demodulator that demodulates the low-frequency signal output from the low-frequency amplifier. The PLL circuit includes: a voltage controlled oscillator; a frequency divider that divides an oscillation signal of the voltage controlled oscillator and outputs a divided oscillation signal; a first phase comparator that outputs a phase difference between the divided oscillation signal of the frequency divider and a reference signal; a charge pump that converts the output signal of the first phase comparator into a signal for controlling the voltage controlled oscillator; a filter that allows a DC component of the output signal of the charge pump to pass therethrough and outputs a voltage to the voltage controlled oscillator; a second phase comparator that averages the phase difference between the divided oscillation signal of the frequency divider and the reference signal with respect to time; and a current control circuit that controls an operating current of the frequency divider based on the phase difference averaged with respect to time by the second phase comparator.

The wireless device according to the present invention can receive radio waves of a wide oscillation frequency range. Further, since the wireless device includes the PLL circuit that is driven with low power consumption, long-time reception and viewing become possible. Further, due to the inclusion of the PLL circuit that is driven with low power consumption, there is no need to prepare a larger battery, and thus a small mobile device can be provided.

Further, the wireless device according to the present invention is adaptable to a communication standard with a different frequency band. Further, it is possible to provide a small mobile device suitable for a long-time operation.

DETAILED DESCRIPTION OF THE INVENTION

Figure 1:
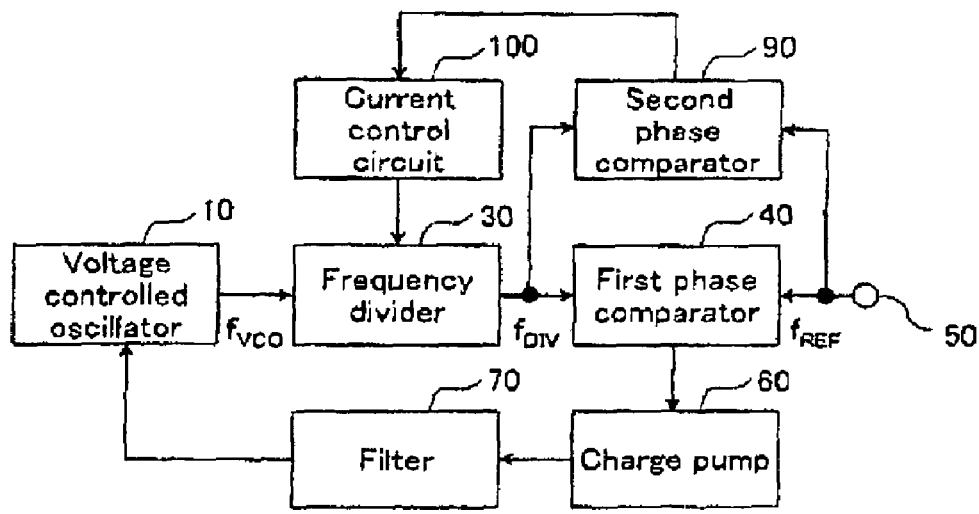
FIG. 1 is a block diagram showing a configuration of a PLL circuit according to a first embodiment.

The PLL circuit according to the present invention further may include an amplifier connected between the voltage controlled oscillator and the frequency divider, and the current control circuit may control one or both of the operating currents of the amplifier and the frequency divider.

Further, the current control circuit may control one or both of the currents of the amplifier and the frequency divider by a control input terminal for receiving an external control signal.

The PLL circuit further may include a voltage switching device. The voltage switching device may be connected between the filter and the voltage controlled oscillator, and may select and output a constant voltage or the output voltage of the filter in accordance with the output result of the second phase comparator.

Hereinafter, embodiments according to the present invention will be described with reference to the drawings. Note here that the same components are denoted with the same reference numerals through the embodiments.

First Embodiment

Figure 13:
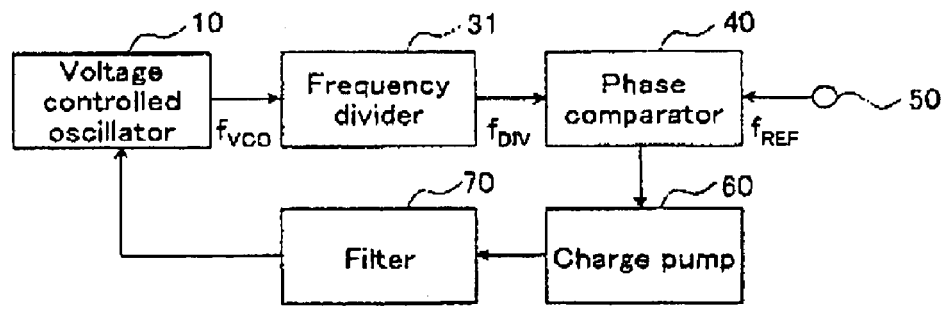
FIG. 13 is a block diagram showing a configuration of a PLL circuit with a first conventional configuration.
Figure 14:
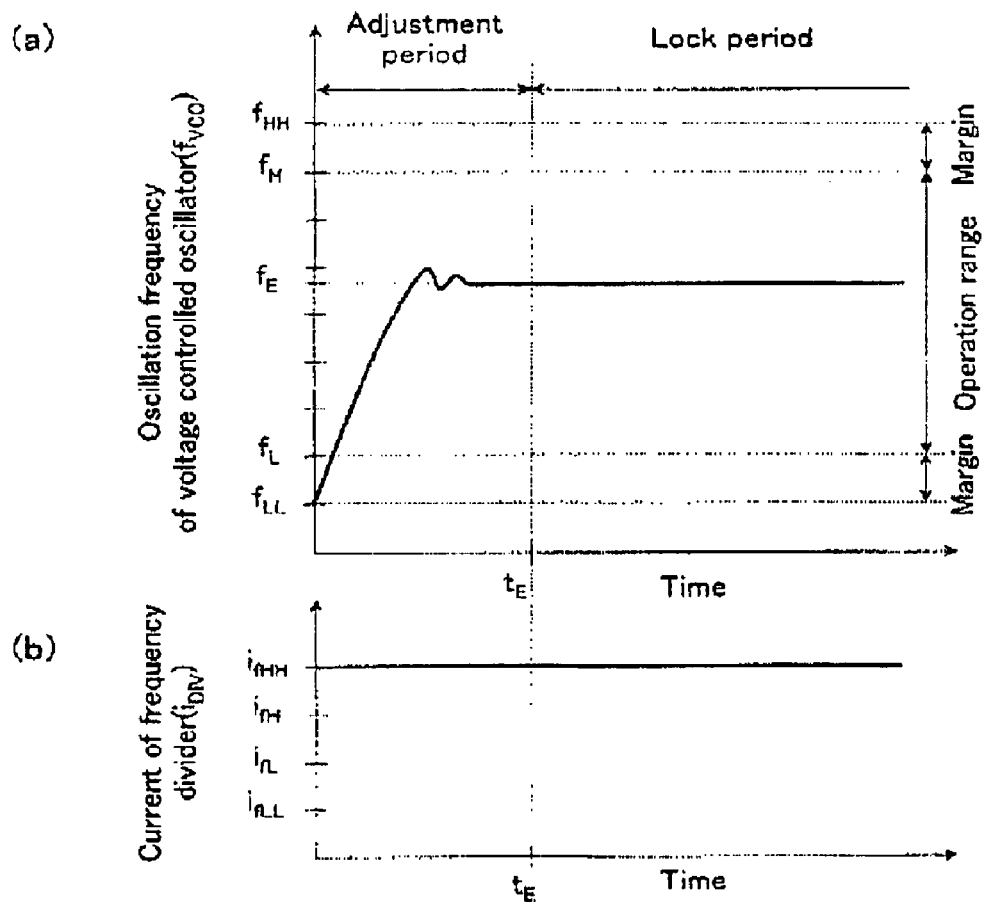
FIG. 14 is a characteristic diagram showing an oscillation frequency and a current of a frequency divider in the first conventional configuration.

FIG. 1 is a block diagram showing a configuration of a PLL circuit according to a first embodiment. The PLL circuit shown in FIG. 1 includes a second phase comparator 90 and a current control circuit 100 in addition to the components of the PLL circuit shown in FIG. 13. In the present embodiment, a description will be given mainly of a difference from the PLL circuit in FIG. 13.

The PLL circuit shown in FIG. 1 includes a voltage controlled oscillator 10, a frequency divider 30, a first phase comparator 40, a reference signal input terminal 50, a charge pump 60, a filter 70, the second phase comparator 90, and the current control circuit 100.

The frequency divider 30 divides an oscillation signal ($f_{VCO}$) of the voltage controlled oscillator 10 at such a dividing ratio that the oscillation signal has the same frequency as that of a reference signal ($f_{REF}$) input from the reference signal input terminal 50 to the first phase comparator 40. The first phase comparator 40 outputs a signal including information on a phase difference between a divided oscillation signal ($f_{DIV}$) output from the frequency divider 30 and the reference signal ($f_{REF}$) input from the reference signal input terminal 50. The charge pump 60 converts the output signal of the first phase comparator 40 into a signal suitable for control of the voltage controlled oscillator 10. The filter 70 allows a DC (direct current) component of the output signal of the charge pump 60 to pass therethrough so as to apply a control voltage to the voltage controlled oscillator 10. The voltage controlled oscillator 10 oscillates at a frequency ($f_{VCO}$) in accordance with the control voltage output from the filter 70. An oscillation signal output from the voltage controlled oscillator 10 is input to the frequency divider 30, followed by the repetition of the above-described operation.

By repeated cycles of the above-described operation, when the frequency $f_{DIV}$ of the divided oscillation signal output from the frequency divider 30 is matched with the frequency $f_{REF}$ of the reference signal input from the reference signal input terminal 50, the PLL circuit shown in FIG. 1 is locked.

Figure 2:
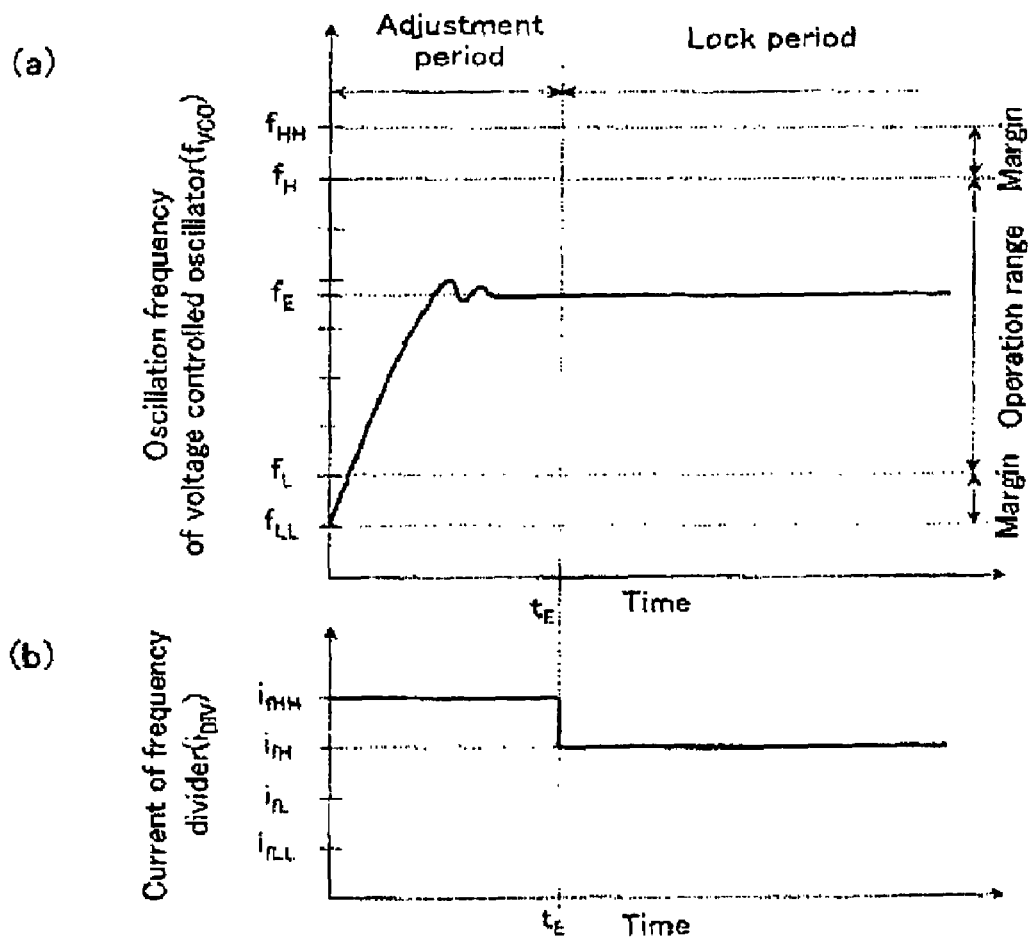
FIG. 2 is a characteristic diagram showing an oscillation frequency and a current of a frequency divider in the first embodiment.

The second phase comparator 90 compares the frequency $f_{DIV}$ of the divided oscillation signal output from the frequency divider 30 with the frequency $f_{REF}$ of the reference signal input from the reference signal input terminal 50, and averages a phase difference between $f_{DIV}$ and $f_{REF}$ with respect to time. The second phase comparator 90 outputs a control signal when the phase difference between $f_{DIV}$ and $f_{REF}$ is adjusted within a predetermined range. The control signal output from the second phase comparator 90 is input to the current control circuit 100. The current control circuit 100 performs control so as to adjust an operating current $i_{DIV}$ of the frequency divider 30 in accordance with the control signal output from the second phase comparator 90. In FIG. 2, a timing at which the oscillation frequency $f_{VCO}$ is matched with a lock frequency $f_E$ is different from a timing ($t_E$) at which the operating current $i_{DIV}$ is changed from $i_{fHH}$ to $i_{fH}$ because the phase difference between $f_{DIV}$ and $f_{REF}$ is averaged with respect to time.

In FIG. 2, (a) is a characteristic diagram showing a change of the oscillation frequency $f_{VCO}$ with time in the PLL circuit shown in FIG. 1, and (b) is a characteristic diagram showing a change of the operating current $i_{DIV}$ of the frequency divider 30 with time. The timing $t_E$ on a horizontal axis in FIG. 2 is a timing at which the PLL circuit in FIG. 1 is locked. In FIG. 2, $f_L$, $f_H$, $f_{LL}$, $f_{HH}$, and $f_E$ on a vertical axis in (a) represent a lower limit operation frequency, an upper limit operation frequency, a frequency obtained by subtracting a margin from $f_L$, a frequency obtained by adding a margin to $f_H$, and a lock frequency, respectively, and $i_{fL}$, $i_{fH}$, $i_{fLL}$, and $i_{fHH}$ on a vertical axis in (b) represent the operating currents necessary for the frequency divider 30 to divide the frequency at the set dividing ratio in the cases where $f_{VCO}$ is $f_L$, $f_H$, $f_{LL}$, and $f_{HH}$, respectively. In general, the frequency divider requires a larger operating current to divide a higher frequency. As shown in (a) in FIG. 2, an oscillation frequency range of the voltage controlled oscillator 10 is set with the margins provided in addition to an operation range taking into consideration manufacturing variations of the PLL circuit, temperature fluctuations after the PLL circuit is locked, power supply voltage fluctuations, and the like.

As shown in (a) in FIG. 2, until the timing $t_E$, i.e., during an adjustment period of the PLL circuit, since the oscillation frequency may reach the frequency $f_{HH}$, control is performed so that the operating current $i_{fHH}$ is applied to the frequency divider 30 as shown in (b) in FIG. 2. However, after the timing $t_E$, since the upper limit operation frequency is $f_H$, the frequency divider 30 requires the operating current $i_{fH}$ at most to be operated normally. More specifically, at the timing $t_E$, the second phase comparator 90 outputs the control signal to the current control circuit 100 since the phase difference between the divided oscillation signal ($f_{DIV}$) and the reference signal ($f_{REF}$) is within the predetermined range. The current control circuit 100 performs control so as to decrease the operating current of the frequency divider 30 from $i_{fHH}$ to $i_{fH}$ based on the input control signal.

Figure 3:
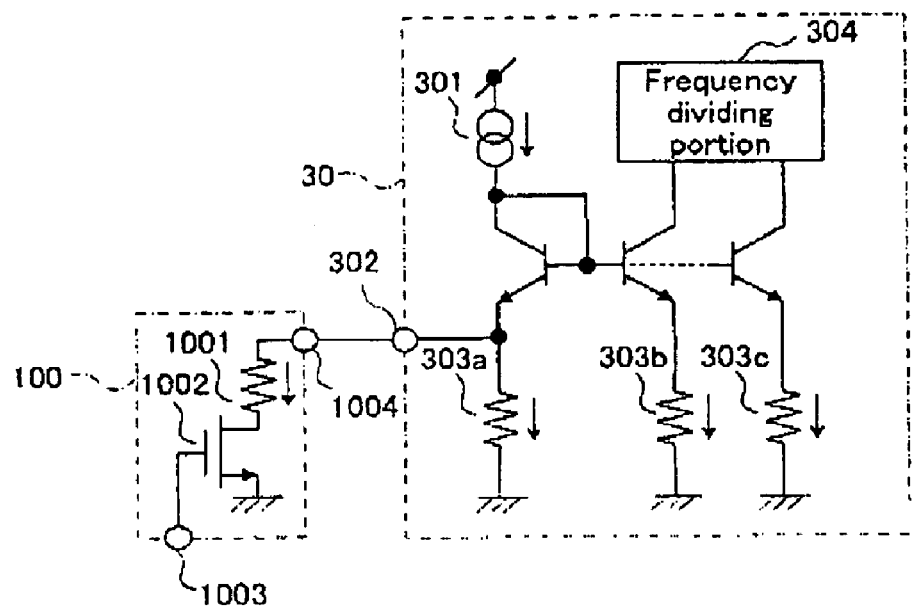
FIG. 3 is a circuit diagram showing an example of a specific configuration of a current control circuit used in the PLL circuit according to the first embodiment.

FIG. 3 is a diagram showing an example of specific configurations of the current control circuit 100 and the frequency divider 30 included in the PLL circuit shown in FIG. 1. The current control circuit 100 includes a resistance 1001, a FET 1002, a control input terminal 1003, and a control output terminal 1004. The frequency divider 30 includes a constant current source 301, a control input terminal 302, resistances 303a, 303b, and 303c, and a frequency dividing portion 304.

In FIG. 3, when a voltage ($V_L$) that turns the FET 1002 OFF is applied to the control input terminal 1003, no current flows through the resistance 1001, and a current of the current source 301 flows through the resistance 303a. On the other hand, when a voltage ($V_H$) that turns the FET 1002 ON is applied to the control input terminal 1003, the current of the current source 301 is divided between the resistance 1001 and the resistance 303a. In this case, the current flowing through the resistance 303a is decreased as compared with the case where the voltage of the control input terminal 1003 is $V_L$, and currents flowing through the resistances 303b and 303c as a current source of the frequency dividing portion 304 also are decreased. In other words, by switching the voltage to be applied to the control input terminal 1003 between $V_H$ and $V_L$, the operating current of the frequency dividing portion 304 can be increased or decreased.

Figure 4A:
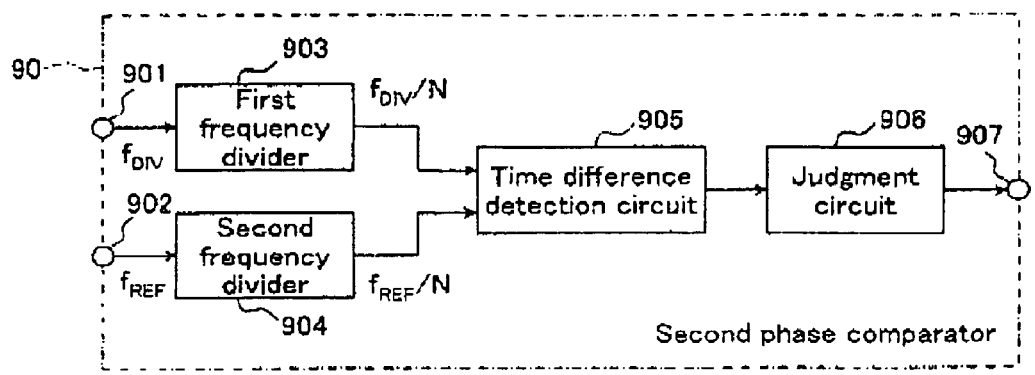
FIG. 4 is a circuit diagram showing an example of a specific configuration of a second phase comparator used in the PLL circuit according to the first embodiment.
Figure 4B:
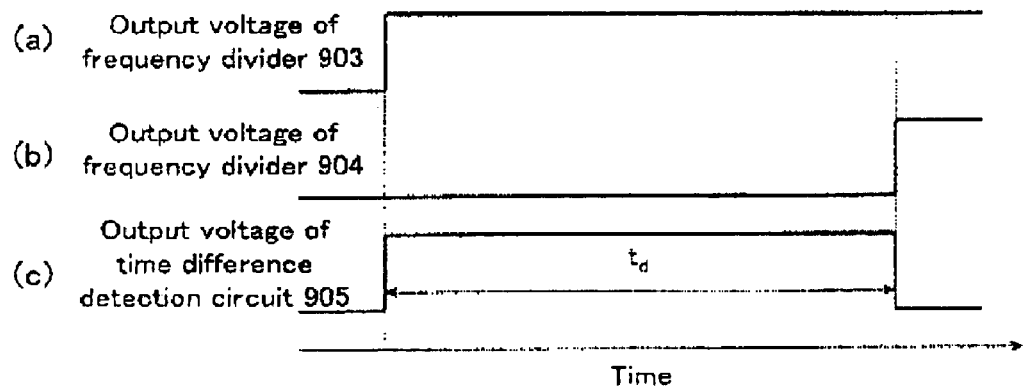

FIG. 4A is a diagram showing an example of a specific configuration of the second phase comparator 90 included in the PLL circuit shown in FIG. 1. FIG. 4B is a timing chart showing an operation of the second phase comparator 90 shown in FIG. 4A.

As shown in FIG. 4A, the second phase comparator 90 includes a divided oscillation signal input terminal 901, a reference signal input terminal 902, a first frequency divider 903, a second frequency divider 904, a time difference detection circuit 905, a judgment circuit 906, and a control output terminal 907. The divided oscillation signal with the frequency $f_{DIV}$ is input to the divided oscillation signal input terminal 901, and the reference signal with the frequency $f_{REF}$ is input to the reference signal input terminal 902. The first frequency divider 903 divides the input divided oscillation signal ($f_{DIV}$) at a set dividing ratio N, and outputs a divided oscillation signal with a frequency $f_{DIV}/N$. The second frequency divider 904 divides the input reference signal ($f_{REF}$) at the set dividing ratio N, and outputs a reference signal with a frequency $f_{REF}/N$. The signals output from the first frequency divider 903 and the second frequency divider 904 are input to the time difference detection circuit 905. The time difference detection circuit 905 compares the input reference signal ($f_{REF}$) and divided oscillation signal ($f_{DIV}$) to detect a phase difference therebetween. A detection result of the time difference detection circuit 905 is input to the judgment circuit 906. The judgment circuit 906 outputs the voltage $V_L$ from the control output terminal 907 when the phase difference between the divided oscillation signal ($f_{DIV}$) and the reference signal ($f_{REF}$) is large, i.e., during the adjustment period of the PLL circuit. On the other hand, when the phase difference between the divided oscillation signal ($f_{DIV}$) and the reference signal ($f_{REF}$) is small, i.e., when the PLL circuit is locked, the judgment circuit 906 outputs the voltage $V_H$ from the control output terminal 907. The voltage $V_L$ or $V_H$ output from the control output terminal 907 is applied to the control input terminal 1003 of the current control circuit 100.

FIG. 4B is a chart showing the relationship between time and each of the output voltages of the first frequency divider 903, the second frequency divider 904, and the time difference detection circuit 905. In FIG. 4B, a time $t_d$ shown in (c) represents a period "H" of the output voltage of the time difference detection circuit 905, which is a result of detecting the time difference between the output voltage of the first frequency divider 903 shown in (a) and the output voltage of the second frequency divider 904 shown in (b). When the dividing ratio N of the first frequency divider 903 and the second frequency divider 904 is larger, the time $t_d$ becomes longer. The time difference detection circuit 905 can be constituted by a EX-OR circuit, for example.

Here, a description will be given of the case where the current control circuit 100 uses the detection result of the first phase comparator 40 to adjust the current of the frequency divider 30. Since the first phase comparator 40 detects the phase difference based on the short-period reference signal ($f_{REF}$), the current control circuit 100 performs control so as to decrease the current of the frequency divider 30 even when the frequency $f_{VCO}$ becomes low for a moment during the adjustment period of the PLL circuit, i.e., an unstable period in which the voltage controlled oscillator 10 oscillates in a free-running manner. In such a case, the frequency divider 30 does not divide the oscillation signal ($f_{VCO}$) at the set dividing ratio, resulting in a problem that the PLL circuit may be unlocked.

On the other hand, the second phase comparator 90 is operated so as to count pulses of the divided oscillation signal ($f_{DIV}$) for a long time by the first frequency divider 903, and thus the signal with the frequency $f_{DIV}/N$ can be obtained by averaging the unstable divided oscillation signal ($f_{DIV}$) with respect to time. More specifically, even when the frequency $f_{VCO}$ becomes low for a moment, the current of the frequency divider 30 is not decreased due to the time-averaging, and thus the PLL circuit is prevented from being unlocked. Further, the reference signal ($f_{REF}$) also is divided by the second frequency divider 904 to be the signal with the frequency $f_{REF}/N$. As a result, the time difference between the divided oscillation signal ($f_{DIV}$) and the reference signal ($f_{REF}$) becomes larger, and accordingly the time $t_d$ output from the time difference detection circuit 905 becomes longer. The judgment circuit 906 measures the time $t_d$ with a counter, for example, and outputs the control signal when judging that the measurement result is not more than a predetermined time.

Figure 5:
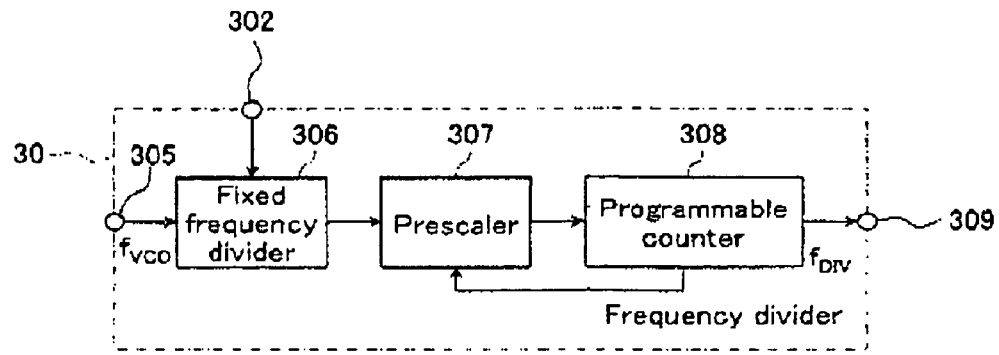
FIG. 5 is a circuit diagram showing an example of a specific configuration of the frequency divider used in the PLL circuit according to the first embodiment.

FIG. 5 is a diagram showing an example of a specific configuration of 5 the frequency divider 30 included in the PLL circuit shown in FIG. 1. As shown in FIG. 5, the frequency divider 30 includes a control input terminal 302, an oscillation signal input terminal 305, a fixed frequency divider 306, a prescaler 307, a programmable counter 308, and a divided oscillation signal output terminal 309. The prescaler 307 and the programmable counter 308, which are general components to be arranged upstream of the frequency divider, are connected with the fixed frequency divider 306. A current of the fixed frequency divider 306 is controlled by a control signal input to the control input terminal 302. Since the frequency $f_{VCO}$ of the oscillation signal input to the fixed frequency divider 306 is the highest among the frequencies handled in the frequency divider 30, the fixed frequency divider 306 requires a large current. For this reason, it is most effective to control the current of the fixed frequency divider 306.

As described above, according to the PLL circuit of the first embodiment, even when the PLL circuit generates a wide range of frequencies from a low frequency to a high frequency, the current control circuit 100 performs control so as to decrease the current of the frequency divider 30 in accordance with the output result of the second phase comparator 90, thereby achieving low power consumption and a wide oscillation frequency range.

In the first embodiment, the current control circuit 100 has the configuration shown in FIG. 3. However, the current control circuit 100 may have any configuration as long as it at least can control the current of the frequency divider 30 by directly controlling the current of the constant current source 301, for example.

In the first embodiment, the second phase comparator 90 has the configuration shown in FIG. 4A. However, the second phase comparator 90 may have any configuration as long as it at least can detect the phase difference between the divided oscillation signal ($f_{DIV}$) and the reference signal ($f_{REF}$) by the time-averaging.

In the first embodiment, the current control circuit 100 is configured to control the current of the fixed frequency divider 306 of the frequency divider 30. However, the current control circuit 100 also may be configured to control the currents of the prescaler 307 and the programmable counter 308 as well as the current of the fixed frequency divider 306. Further, the frequency divider 30 may have any configuration as long as it can divide the input signal.

Second Embodiment

Figure 6:
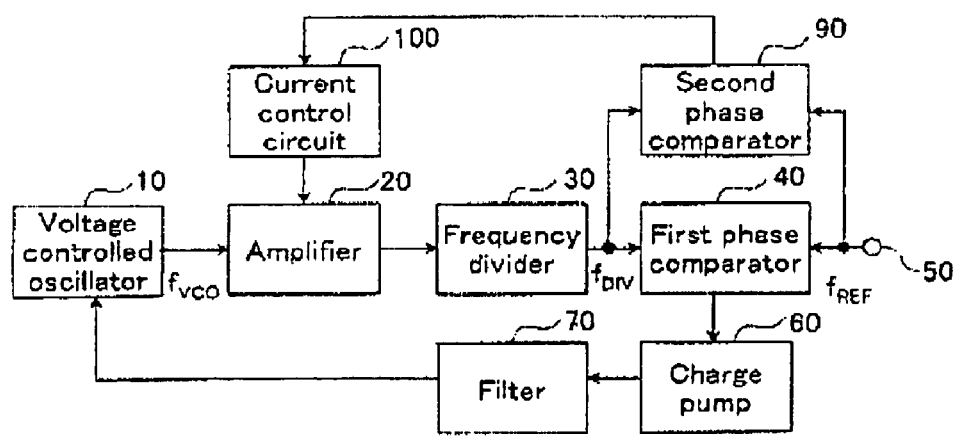
FIG. 6 is a block diagram showing a configuration of a PLL circuit according to a second embodiment.

FIG. 6 is a block diagram showing a configuration of a PLL circuit according to a second embodiment. The PLL circuit shown in FIG. 6 is different from the PLL circuit shown in FIG. 1 in that an amplifier 20 is connected between the voltage controlled oscillator 10 and the frequency divider 30, so that the current control circuit 100 controls a current of the amplifier 20.

The PLL circuit shown in FIG. 6 includes the voltage controlled oscillator 10, the amplifier 20, the frequency divider 30, the first phase comparator 40, the reference signal input terminal 50, the charge pump 60, the filter 70, the second phase comparator 90, and the current control circuit 100.

The amplifier 20 amplifies an oscillation signal ($f_{VCO}$) with the highest frequency among frequencies of signals processed in the PLL circuit to such a level that the frequency divider 30 can divide the signal normally. The current control circuit 100 controls the operating current of the amplifier 20 in accordance with the characteristic diagram shown in FIG. 2. In the second embodiment, a description will be given assuming that the current $i_{DIV}$ in FIG. 2 is the operating current of the amplifier 20. Other operations are the same as those in the first embodiment, and thus their descriptions will be omitted.

In FIG. 6, the amplifier 20 requires the largest operating current in the PLL circuit shown in FIG. 6 since it handles the oscillation signal ($f_{VCO}$) with the highest frequency. Thus, in order to decrease an operating current of the PLL circuit shown in FIG. 6, it is effective to decrease the operating current of the amplifier 20. Since the amplifier 20 has a relatively simple configuration in contrast to the frequency divider 30, a malfunction is less likely to occur by decreasing the operating current.

According to the PLL circuit of the second embodiment, even when the PLL circuit generates a wide range of frequencies from a low frequency to a high frequency, it is possible to decrease the current of the amplifier 20 that requires the largest operating current in the PLL circuit, thereby reducing power consumption. In the present embodiment, the current control circuit 100 is configured to control only the operating current of the amplifier 20. However, the current control circuit 100 also may be configured to control one or both of the operating currents of the amplifier 20 and the frequency divider 30.

Third Embodiment

Figure 7:
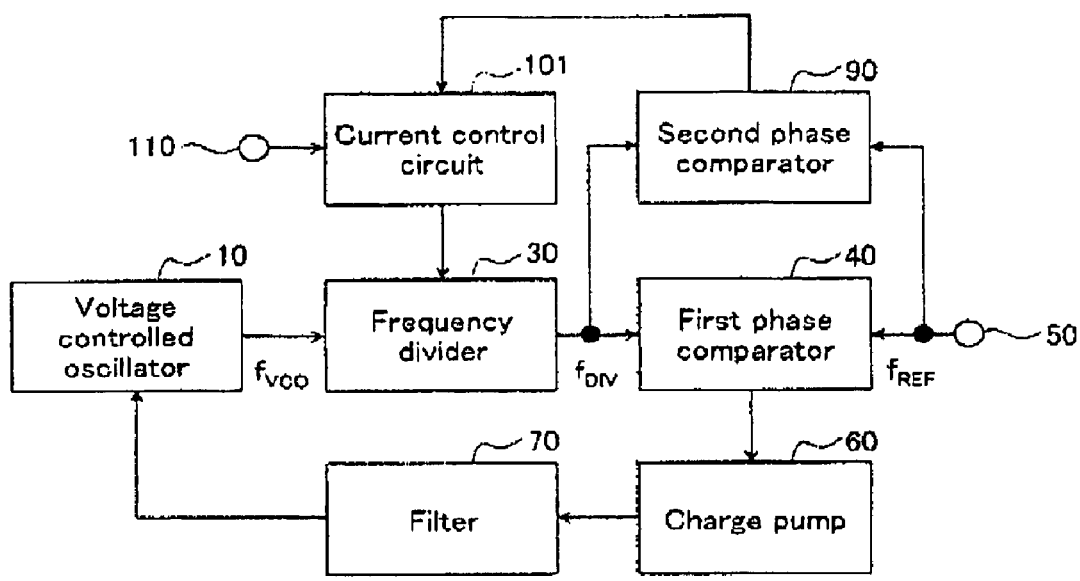
FIG. 7 is a block diagram showing a configuration of a PLL circuit according to a third embodiment.

FIG. 7 is a block diagram showing a configuration of a PLL circuit according to a third embodiment. The PLL circuit shown in FIG. 7 is different from the PLL circuit shown in FIG. 1 in that a control input terminal 110 is added to the current control circuit 100.

The PLL circuit shown in FIG. 7 includes the voltage controlled oscillator 10, the frequency divider 30, the first phase comparator 40, the reference signal input terminal 50, the charge pump 60, the filter 70, the second phase comparator 90, and a current control circuit 101.

In FIG. 7, the current control circuit 101 controls a current of the frequency divider 30 based on signals input from the control input terminal 110 and the second phase comparator 90. A control signal generated based on information on a frequency to which the PLL circuit is locked is input to the control input terminal 110. The control signal is generated based on information on a dividing ratio of the frequency divider 30, for example. Other operations are the same as those in the first embodiment, and thus their descriptions will be omitted.

Figure 8:
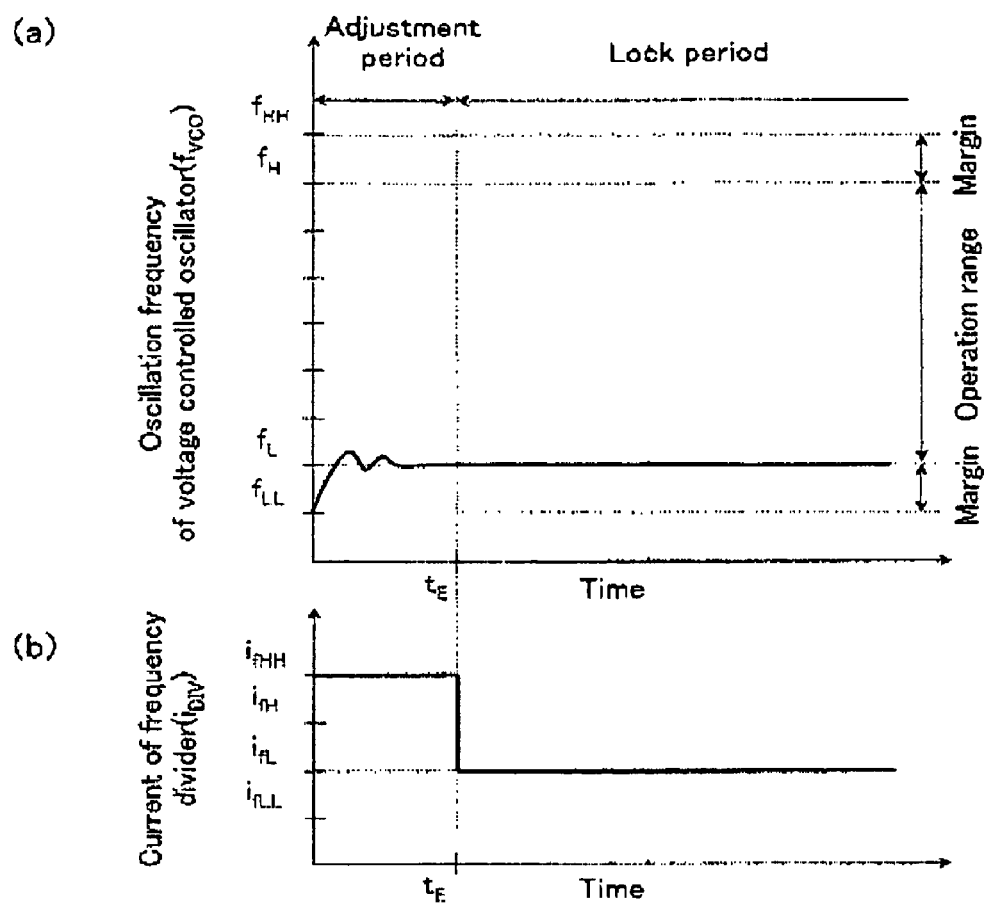
FIG. 8 is a characteristic diagram showing an oscillation frequency and a current of a frequency divider in the third embodiment.

FIG. 8 is a characteristic diagram showing a PLL operation of the PLL circuit shown in FIG. 7. Respective symbols in FIG. 8 are the same as those in FIG. 2, and thus their descriptions will be omitted. FIG. 8 shows a characteristic in the case where the PLL circuit is locked to the lower limit operation frequency $f_L$. As shown in (a) in FIG. 8, until the timing $t_E$, i.e., during an adjustment period of the PLL circuit, since the frequency $f_{VCO}$ of an oscillation signal may reach the frequency $f_{HH}$, it is required to apply the current $i_{fHH}$ to the frequency divider 30 as shown in (b) in FIG. 8. However, after the timing $t_E$, since the lock frequency of the PLL circuit is $f_L$, the frequency divider 30 requires the current $i_{fL}$. In FIG. 8, a timing at which the oscillation frequency $f_{VCO}$ is matched with the frequency $f_L$ is different from a timing ($t_E$) at which the operating current $i_{DIV}$ is changed from $i_{fHH}$ to $i_{fL}$ because a phase difference between $f_{DIV}$ and $f_{REF}$ is averaged with respect to time.

Figure 9:
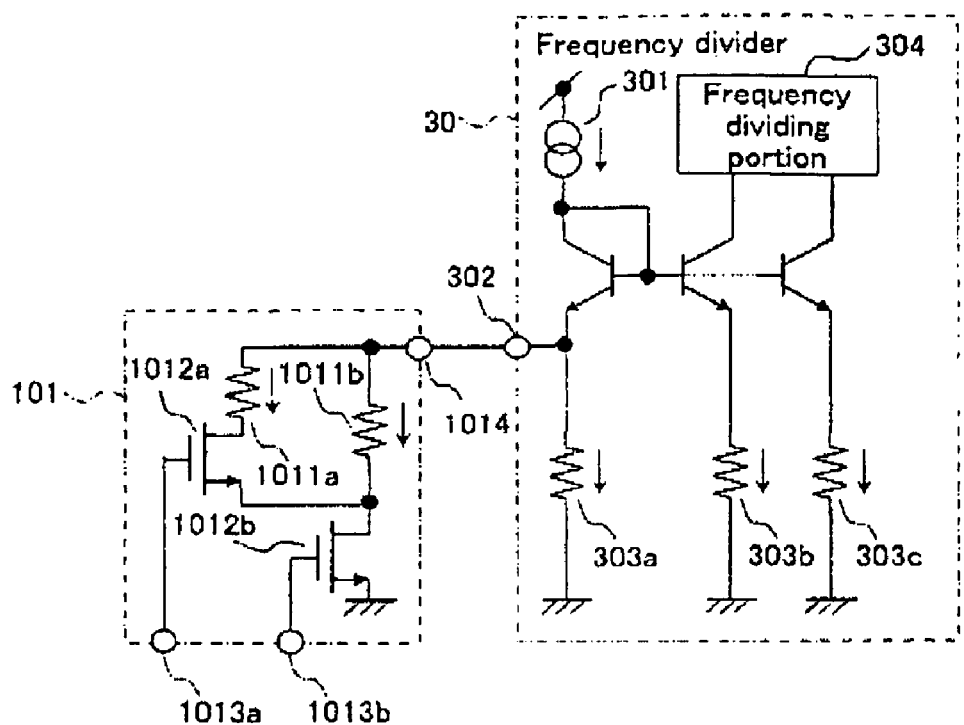
FIG. 9 is a circuit diagram showing an example of a specific configuration of a current control circuit used in the PLL circuit according to the third embodiment.

FIG. 9 is a diagram showing an example of specific configurations of the current control circuit 101 and the frequency divider 30 connected to the current control circuit 101 included in the PLL circuit shown in FIG. 7. The current control circuit 101 shown in FIG. 9 includes resistances 1011a and 1011b, FETs 1012a and 1012b, control input terminals 1013a and 1013b, and a control output terminal 1014. The frequency divider 30 includes the constant current source 301, the control input terminal 302, the resistances 303a, 303b, and 303c, and the frequency dividing portion 304. The current control circuit 101 shown in FIG. 9 is different from the current control circuit 100 shown in FIG. 3 in that another set of the control input terminal, the FET, and the resistance is added.

The control input terminal 1013a is connected to the control input terminal 110 shown in FIG. 7. The control input terminal 1013b is connected to an output of the second phase comparator 90 shown in FIG. 7. To the control input terminal 1013a, the voltage $V_L$ is applied when the lock frequency of the PLL circuit is $f_H$, and the voltage $V_H$ is applied when the lock frequency of the PLL circuit is $f_L$. When the voltage $V_H$ is applied to both the control input terminals 1013a and 1013b, i.e., when the PLL circuit is locked to a low frequency, a current flows through both the resistances 1011a and 1011b, and a current flowing through the resistance 303a is decreased, so that the operating current of the frequency divider 30 becomes the smallest.

According to the PLL circuit of the third embodiment, even when the PLL circuit generates a wide range of frequencies from a low frequency to a high frequency, it is possible to control and decrease the operating current of the frequency divider 30 based on whether the PLL circuit is locked or not and whether the lock frequency is high or low, thereby reducing power consumption.

In the present embodiment, the description has been given taking as an example the case where the operating current of the frequency divider 30 is controlled in two stages after the PLL circuit is locked based on whether the frequency is high or low. However, the control may be performed in three or more stages.

In the present embodiment, the current control circuit 101 has the configuration as shown in FIG. 9. However, the current control circuit 101 may have another configuration as long as it can control the current in stages.

In the present embodiment, the current control circuit 101 is configured to control only the current of the frequency divider 30. However, in the case where the PLL circuit includes the amplifier 20 as shown in FIG. 6, the current control circuit 101 may be configured to control one or both of the currents of the amplifier 20 and the frequency divider 30. Further, the amplifier 20 and the frequency divider 30 may be controlled in stages different from each other.

Fourth Embodiment

Figure 10:
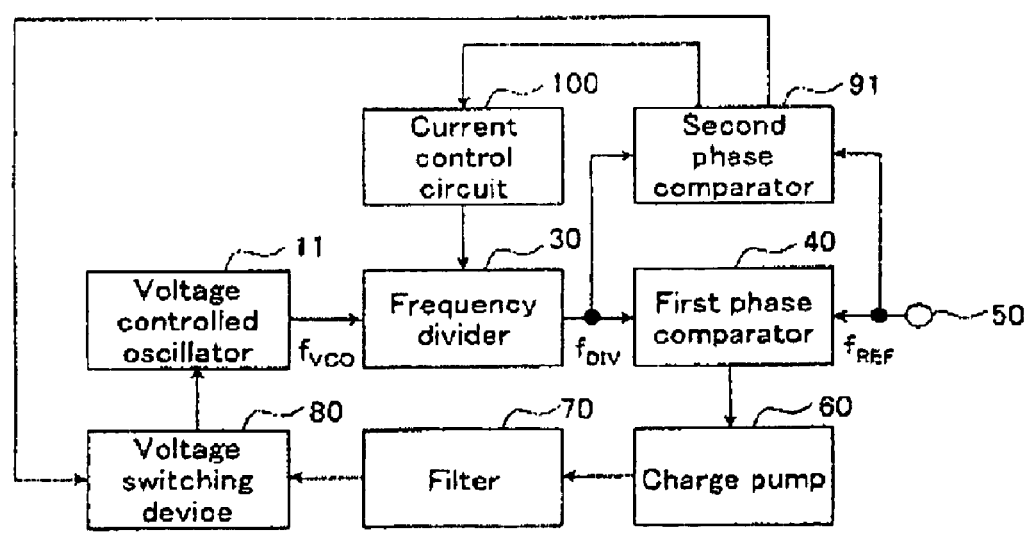
FIG. 10 is a block diagram showing a configuration of a PLL circuit according to a fourth embodiment.
Figure 15:
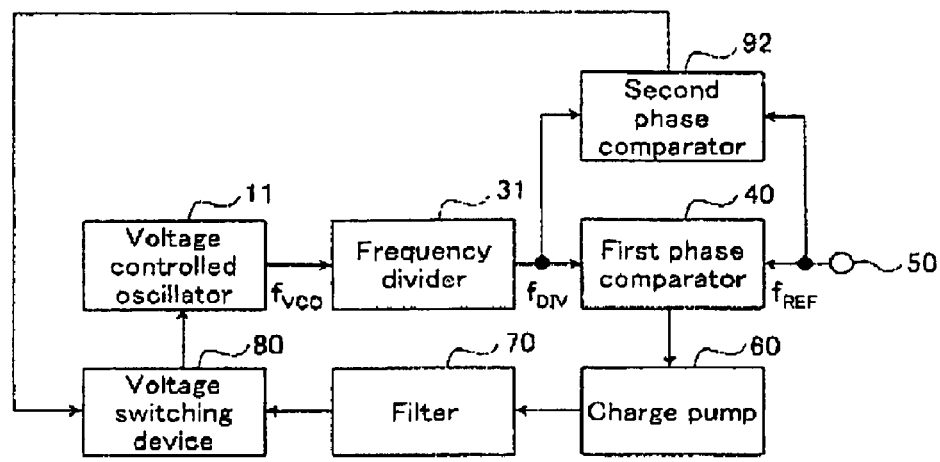
FIG. 15 is a block diagram showing a configuration of a PLL circuit with a second conventional configuration.
Figure 16:
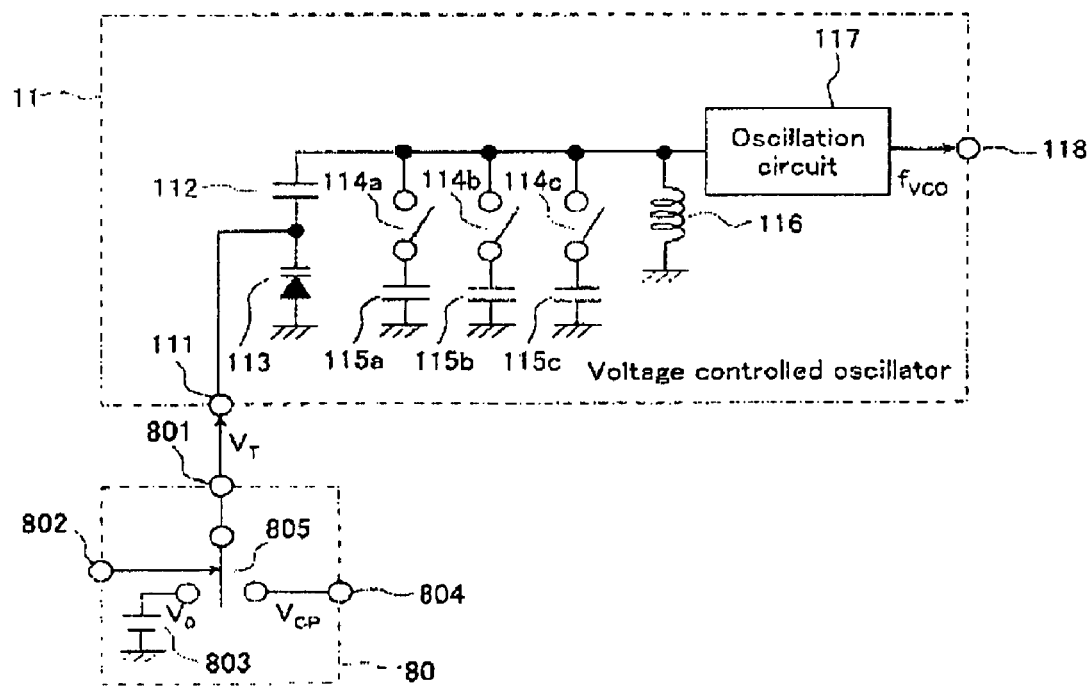
FIG. 16 is a circuit diagram showing a voltage controlled oscillator and a voltage switching device in the second conventional configuration.
Figure 17:
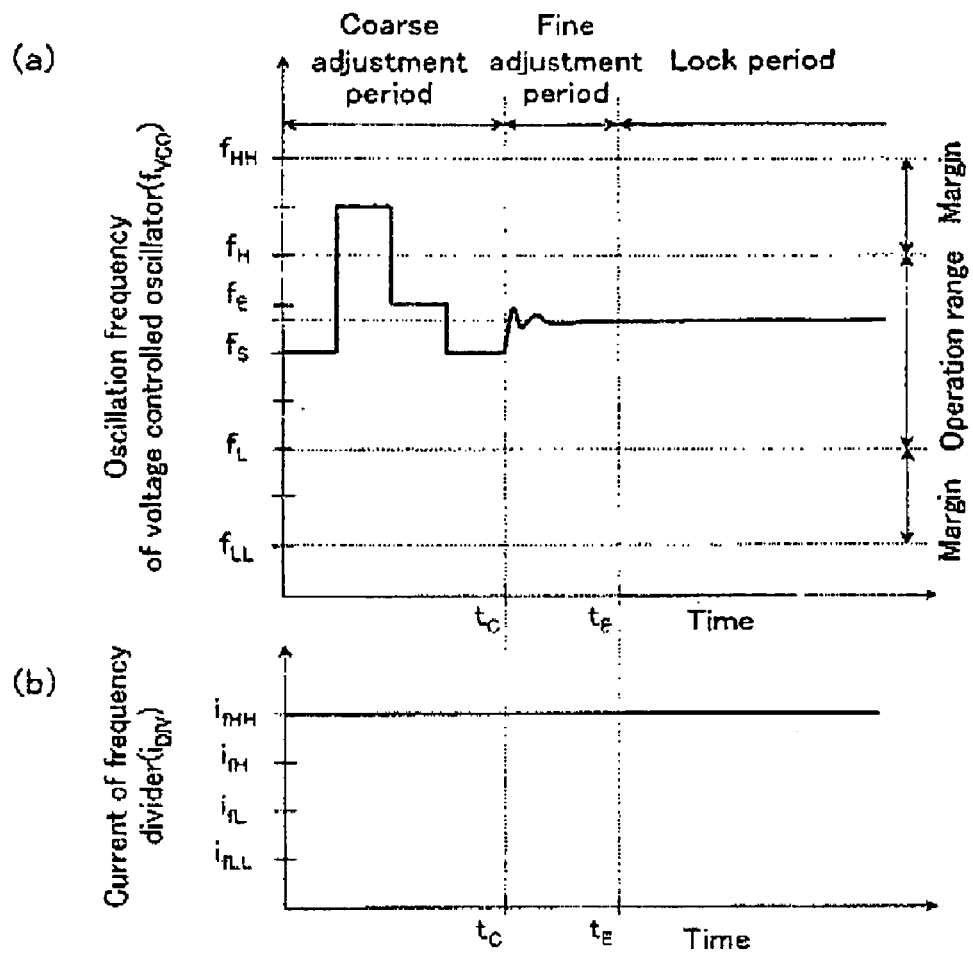
FIG. 17 is a characteristic diagram showing an oscillation frequency and a current of a frequency divider in the second conventional configuration.

FIG. 10 is a block diagram showing a configuration of a PLL circuit according to a fourth embodiment. The PLL circuit shown in FIG. 10 is different from the PLL circuit shown in FIG. 1 in that the voltage switching device 80 shown in FIG. 15 is added.

The PLL circuit shown in FIG. 10 includes the voltage controlled oscillator 11, the frequency divider 30, the first phase comparator 40, the reference signal input terminal 50, the charge pump 60, the filter 70, the voltage switching device 80, a second phase comparator 91, and the current control circuit 100. In the PLL circuit shown in FIG. 10, an output of the second phase comparator 91 is connected to the current control circuit 100 and the voltage switching device 80. The current control circuit 100 controls a current of the frequency divider 30. The voltage switching device 80 switches between a coarse adjustment period and a fine adjustment period of the PLL circuit. Other operations are the same as those in the first embodiment and the second conventional configuration, and thus their descriptions will be omitted.

Figure 11:
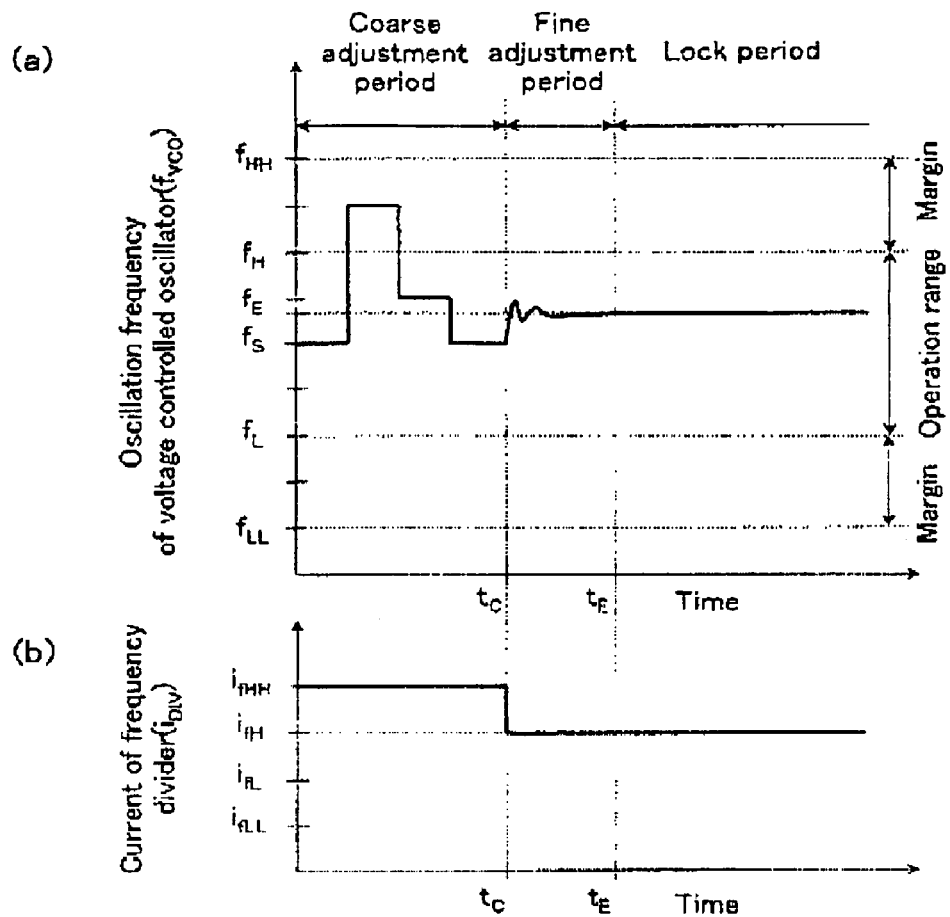
FIG. 11 is a characteristic diagram showing an oscillation frequency and a current of a frequency divider in the fourth embodiment.

FIG. 11 is a characteristic diagram showing a PLL operation of the PLL circuit shown in FIG. 10. As shown in (b) in FIG. 11, the current control circuit 100 decreases the operating current $i_{DIV}$ of the frequency divider 30 to $i_H$ at the timing $t_C$ of finishing the coarse adjustment period. As shown in (a) in FIG. 11, the frequency $f_{VCO}$ of an oscillation signal does not fluctuate greatly after the coarse adjustment, and thus the current of the frequency divider 30 can be decreased. Since the second phase comparator 91 is used to control both the current control circuit 100 and the voltage switching device 80, there is no need to add a new component, which causes little increase in cost and power consumption.

According to the PLL circuit of the fourth embodiment, even when the PLL circuit generates a wide range of frequencies from a low frequency to a high frequency, it is possible to decrease the current of the frequency divider 30 without the need of adding a component, thereby achieving a cost reduction as well as low power consumption and a wide oscillation frequency range.

In the present embodiment, the second phase comparator 91 includes two output terminals to which respective signal lines are connected, and outputs the control signal through the signal lines. The second phase comparator 91 may control the current control circuit 100 and the voltage switching device 80 by the control signal output through the two signal lines at timings different from each other. Alternatively, the second phase comparator 91 may include a single signal line to control the current control circuit 100 and the voltage switching device 80 at the same time. In the case where the current control circuit 100 and the voltage switching device 80 are controlled at timings different from each other, it is preferred to delay the control timing of the current control circuit 100 so as to operate the PLL circuit stably.

As described in the second and third embodiments, it is possible to control an amplifier by the control signal output from the second phase comparator 91.

Further, the current of the frequency divider may be made different depending on the lock frequency.

Fifth Embodiment

Figure 12:
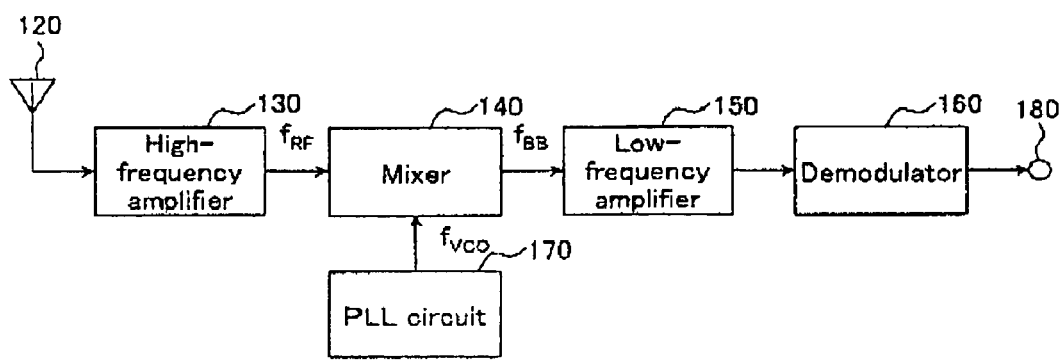
FIG. 12 is a block diagram showing a configuration of a PLL circuit according to a fifth embodiment and a wireless device using the same.

FIG. 12 is a block diagram showing a configuration of a PLL circuit according to a fifth embodiment and a wireless device equipped with the PLL circuit. The PLL circuit shown in any of FIGS. 1, 6, 7, and 10 can be used as a PLL circuit 170 in FIG. 12.

The wireless device shown in FIG. 12 includes an antenna 120, a high-frequency amplifier 130, a mixer 140, a low-frequency amplifier 170, a demodulator 160, the PLL circuit 170, and a demodulation output terminal 180.

As shown in FIG. 12, the antenna 120 converts a radio wave of a broadcast, communication, and the like into a voltage (power), and inputs the same as a high-frequency signal to the high-frequency amplifier 130. The high-frequency amplifier 130 amplifies the input high-frequency signal to a predetermined level, and inputs the same to the mixer 140. The PLL circuit 170 inputs an oscillation signal to another input terminal of the mixer 140. The mixer 140 generates a low-frequency signal to be output to the low-frequency amplifier 150 based on the high-frequency signal input from the high-frequency amplifier 130 and the oscillation signal input from the PLL circuit 170.

Here, assuming that the high-frequency signal has a frequency of $f_{RF}$, the oscillation signal has a frequency of $f_{VCO}$, and the low-frequency signal has a frequency of $f_{BB}$, the following relationship is satisfied.

$$f_{BB} = |f_{VCO} - f_{RF}| \quad \text{(Formula 1)}$$

The low-frequency amplifier 150 amplifies the low-frequency signal to a predetermined level, restricts the passage of frequency components other than the frequency $f_{BB}$, and outputs the signal to the demodulator 160. The demodulator 160 converts the input low-frequency signal into a signal format that is easy to process, and outputs the same from the demodulation output terminal 180.

In general, since the frequency $f_{BB}$ is a fixed frequency, in order for the frequency $f_{RF}$ to cover a wide range of frequencies, the frequency $f_{VCO}$ also has to cover a wide range of frequencies based on (Formula 1). As described above, when the PLL circuit shown in any of FIGS. 1, 6, 7, and 10 is used as the PLL circuit 170, the frequency $f_{RF}$ can cover a wide range of frequencies.

According to the fifth embodiment, since the PLL circuit 170 covers a wide range of frequencies, it is possible to receive broadcasts at frequencies ranging from a low frequency to a high frequency, and to reduce power consumption.

In the present embodiment, the description has been given of the configuration of a receiver of the wireless device. However, the PLL circuit of the present embodiment also can be mounted on a transmitter.

According to the PLL circuit of the present invention, even when the PLL circuit generates a wide range of frequencies from a low frequency to a high frequency, the current control circuit is operated to decrease the current of the frequency divider in accordance with the output result of the second phase comparator, thereby achieving low power consumption as well as a wide oscillation frequency range. Therefore, the PLL circuit is useful for a tuner that is required to receive broadcasts in a wide range of frequencies and to achieve low power consumption. Further, the PLL circuit also is useful for a communication system that is required to be adapted to a communication standard with a different frequency band and to achieve low power consumption.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A PLL circuit comprising:
   a voltage controlled oscillator;
   a frequency divider that divides an oscillation signal of the voltage controlled oscillator and outputs a divided oscillation signal;
   a first phase comparator that outputs a phase difference between the divided oscillation signal of the frequency divider and a reference signal;
   a charge pump that converts the output signal of the first phase comparator into a signal for controlling the voltage controlled oscillator;
   a filter that allows a DC component of the output signal of the charge pump to pass therethrough and outputs a voltage to the voltage controlled oscillator;
   a second phase comparator that averages the phase difference between the divided oscillation signal of the frequency divider and the reference signal with respect to time; and
   a current control circuit that controls an operating current of the frequency divider based on the phase difference averaged with respect to time by the second phase comparator.

2. The PLL circuit according to claim 1, further comprising an amplifier connected between the voltage controlled oscillator and the frequency divider,
   wherein the current control circuit controls one or both of the operating currents of the amplifier and the frequency divider.

3. The PLL circuit according to claim 1, wherein the current control circuit controls one or both of the currents of the amplifier and the frequency divider by a control input terminal for receiving an external control signal.

4. The PLL circuit according to claim 1, further comprising a voltage switching device,
   wherein the voltage switching device is connected between the filter and the voltage controlled oscillator, and selects and outputs a constant voltage or the output voltage of the filter in accordance with the output result of the second phase comparator.

5. A wireless device capable of at least receiving or transmitting a radio wave, comprising:
   a high-frequency amplifier that amplifies a high-frequency signal received with an antenna;
   a PLL circuit that generates an oscillation signal;
   a mixer that generates a low-frequency signal from the high-frequency signal output from the high-frequency amplifier and the oscillation signal output from the PLL circuit;
   a low-frequency amplifier that amplifies the low-frequency signal output from the mixer; and
   a demodulator that demodulates the low-frequency signal output from the low-frequency amplifier,
   wherein the PLL circuit comprises:
      a voltage controlled oscillator;
      a frequency divider that divides an oscillation signal of the voltage controlled oscillator and outputs a divided oscillation signal;
      a first phase comparator that outputs a phase difference between the divided oscillation signal of the frequency divider and a reference signal;
      a charge pump that converts the output signal of the first phase comparator into a signal for controlling the voltage controlled oscillator;
      a filter that allows a DC component of the output signal of the charge pump to pass therethrough and outputs a voltage to the voltage controlled oscillator;
      a second phase comparator that averages the phase difference between the divided oscillation signal of the frequency divider and the reference signal with respect to time; and
      a current control circuit that controls an operating current of the frequency divider based on the phase difference averaged with respect to time by the second phase comparator.

* * * * *